(12) United States Patent  (10) Patent No.: US 7,593,701 B2
Bellaouar et al.  (45) Date of Patent: Sep. 22, 2009

(54) LOW NOISE CMOS TRANSMITTER CIRCUIT WITH HIGH RANGE OF GAIN

(75) Inventors: Abdellatif Bellaouar, Richardson, TX (US); Michel J. G. J. P. Frechette, Plano, TX (US)

(73) Assignee: Icera Canada ULC, Calgary (CA)

( * ) Notice: Subject to any disclaimer, the term of this patent is extended or adjusted under 35 U.S.C. 154(b) by 436 days.

(21) Appl. No.: 11/409,092

(22) Filed: Apr. 24, 2006

(65) Prior Publication Data

US 2007/0249303 A1 Oct. 25, 2007

(51) Int. Cl.
*H04B 1/04* (2006.01)

(52) U.S. Cl. ............... 455/127.2; 455/127.1; 330/254; 330/256

(58) Field of Classification Search ............... 455/424, 455/425, 456.5, 456.6, 561, 550.1, 575.1, 455/522, 63.1, 67.11, 127.1, 127.2, 127.3, 455/136, 138, 232.1, 234.1, 239.1–250.1, 455/258, 323, 240.1, 115.1, 115.4, 117; 327/513, 327/543, 308, 359, 538; 330/254, 253, 256, 330/255, 266, 140, 278, 279, 129; 375/345, 375/148, 136, 260, 316
See application file for complete search history.

(56) References Cited

U.S. PATENT DOCUMENTS

| 4,415,864 | A | * | 11/1983 | Boeke | 330/253 |
| 5,589,791 | A | * | 12/1996 | Gilbert | 327/359 |
| 5,933,771 | A | | 8/1999 | Tiller et al. | |
| 5,994,961 | A | * | 11/1999 | Lunn et al. | 330/254 |
| 6,329,868 | B1 | * | 12/2001 | Furman | 327/513 |
| 6,657,494 | B2 | | 12/2003 | Twomey | |

(Continued)

FOREIGN PATENT DOCUMENTS

WO WO0062419 A2 10/2000

OTHER PUBLICATIONS

Kwon, J.K., et al., "Wideband High Dynamic Range CMOS Variable Gain Amplifier For Low Voltage and Low Power Wireless Applications", Electronics Letters, May 15, 2003, vol. 39, No. 10, pp. 759-760.

(Continued)

*Primary Examiner*—Duc Nguyen
*Assistant Examiner*—Charles Chow
(74) *Attorney, Agent, or Firm*—Dennis R. Haszko; Eaton Peabody Patent Group, LLC

(57) ABSTRACT

A CMOS automatic gain control (AGC) circuit that receives an analog control voltage and generates a temperature compensated gain voltage to linearly control the gain of a variable gain circuit operating in the sub-threshold region. A PTAT circuit having a resistor network coupled to a current mirror circuit operating in the sub-threshold region establishes a current having an proportional relationship to temperature. This current is used as a supply for a voltage to voltage converter circuit which generates an intermediate voltage in response to the analog control voltage. A linearizing circuit operating in the sub-threshold region pre-conditions the intermediate voltage, which is then applied to a variable gain circuit. The variable gain circuit is operated in the sub-threshold region, and the preconditioned intermediate voltage will control the amount of gain to be substantially linear with respect to the analog control voltage, and with a range of about 85 dB.

18 Claims, 11 Drawing Sheets

U.S. PATENT DOCUMENTS

| | | | |
|---|---|---|---|
| 6,980,052 | B1 | 12/2005 | Stroet |
| 7,015,755 | B2* | 3/2006 | Pettersson et al. ............ 330/254 |
| 7,075,360 | B1* | 7/2006 | Holloway et al. ........... 327/543 |
| 7,323,922 | B1* | 1/2008 | Jones ......................... 327/308 |
| 2003/0034842 | A1* | 2/2003 | Fanous et al. ................ 330/254 |
| 2004/0113691 | A1* | 6/2004 | Kwon et al. ................. 330/254 |
| 2004/0166821 | A1* | 8/2004 | Varra et al. ............... 455/240.1 |
| 2004/0176052 | A1* | 9/2004 | Vilhonen et al. .......... 455/127.1 |
| 2005/0099232 | A1* | 5/2005 | Groe et al. ................... 330/254 |
| 2005/0258900 | A1* | 11/2005 | Caresosa et al. ............. 330/254 |
| 2006/0132224 | A1* | 6/2006 | Kedilaya et al. ............ 327/538 |
| 2006/0141964 | A1* | 6/2006 | Otaka et al. ............... 455/232.1 |
| 2007/0281656 | A1* | 12/2007 | Rostami et al. ............. 455/323 |

OTHER PUBLICATIONS

Liu, W., et al. "CMOS exponential-control variable gain amplifiers", IEE Proc.-Circuits Devices Syst., vol. 151, No. 2, Apr. 2004, pp. 83-86.

Yamaji, Takafumi, et al., "A Temperature-Stable CMOS Variable-Gain Amplifier With 80-dB Linearly Controlled Gain Range", IEEE Journal of Solid-State Circuits, vol. 37, No. 5, May 2002, pp. 553-558.

* cited by examiner

LOW NOISE CMOS TRANSMITTER CIRCUIT WITH HIGH RANGE OF GAIN

FIELD OF THE INVENTION

The present invention relates generally to wireless communication systems. More particularly, the present invention relates to automatic gain control in wireless communication systems.

BACKGROUND OF THE INVENTION

Wireless devices have been in use for many years for enabling mobile communication of voice and data. Such devices can include mobile phones and wireless enabled personal digital assistants (PDA's) for example. FIG. 1 is a generic block diagram of the core components of such wireless devices. The wireless core 10 includes a baseband processor 12 for controlling application specific functions of the wireless device and for providing and receiving voice or data signals to a radio frequency (RF) transceiver chip 14. The RF transceiver chip 14 is responsible for frequency up-conversion of transmission signals, and frequency down-conversion of received signals. RF transceiver chip 14 includes a receiver core 16 connected to an antenna 18 for receiving transmitted signals from a base station or another mobile device, and a transmitter core 20 for transmitting signals through the antenna 18 via a gain circuit 22. Those of skill in the art should understand that FIG. 1 is a simplified block diagram, and can include other functional blocks that may be necessary to enable proper operation or functionality.

FIG. 2 is a more detailed circuit schematic of the transmitter core 20 of wireless core 10 shown in FIG. 1. The transmit core 20 includes an up conversion, or mixer circuit 30, a variable gain circuit 32, an automatic gain control (AGC) circuit 34, output pin 36, SAW filter 38, and driver circuit 40. Those of skill in the art will understand that there may be additional components of the transmit core 20 that are not shown in FIG. 2, but are required to enable proper operation of the circuits. Up conversion circuit 30 receives a baseband signal IN to be transmitted, and up converts the baseband signal to a desired transmission frequency z. The unconverted signal is amplified by variable gain circuit 32 in response to signal VGAIN. VGAIN is generated by AGC circuit 34 in response to control voltage VCONT. AGC circuit 34 is responsible for sensing at least one parameter of the device, such as temperature, process and voltage for example, and adjusting the control signal VGAIN to maintain a substantially linear relationship between VCONT and the gain from variable gain circuit 32. The output of variable gain circuit 32 is coupled to off chip SAW filter 38 via output pin 36, for filtering noise of the signal to be transmitted. The filtered signal is then driven by driver circuit 40 to the antenna 18 of the wireless device.

An important function of wireless core 10 is to control transmission signal gain in response to base station requests. Typically, the base station in communication with the wireless device will instruct the wireless device to increase the gain for transmission, since the previously transmitted signals may have been detected as being sub-optimal. Those of skill in the art will understand that the request from the base station is embedded within the communication signal being transmitted to the wireless device. This increase can be specified as being a 10 dB increase, for example. Alternately, the base station can instruct the wireless device to reduce gain, in order to conserve battery power of the wireless device while maintaining optimal performance. To adjust the gain provided by variable gain circuit 32, baseband processor 12 will generate an analog input control voltage signal VCONT for controlling variable gain circuit 32 to provide the desired gain.

As previously mentioned, the relationship between the desired gain and the voltage level of VCONT should be substantially linear, and many standards presently in use specify a close to linear relationship between VCONT and gain. Such standards include EDGE and WCDMA communications standards for example.

Most radio frequency (RF) devices, which typically include gain circuits, are manufactured using SiGe, GaAs, or other heterojunction technologies. Those of skill in the art will understand the advantages provided by SiGe and GaAs devices. GaAs devices have higher electron mobility, run on low power, and generate less noise than traditional CMOS devices, while SiGe heterojunction devices have good forward gain and low reverse gain characteristics, which translate into low current and high frequency performance than typically available from homojunction or traditional bipolar transistors. Gain circuits fabricated with such technologies generally exhibit a substantially linear relationship between gain and VCONT. However, such manufacturing technologies are relatively new, very complex, and hence expensive. Consequently, the costs for manufacturing these RF devices can be prohibitive. Complementary Metal Oxide Semiconductor (CMOS) technology on the other hand, is a very mature and inexpensive fabrication process for the production of semiconductor devices.

FIG. 3 is an example circuit schematic of the up conversion circuit 30 shown in FIG. 2, implemented in CMOS technology. It is noted that the circuit of FIG. 3 is configured for differential signals, and the circuit of FIG. 2 is a simplified schematic representing the differential signal configuration. Up conversion circuit 30 includes dual differential pairs, each for driving a respective phase of the unconverted signal. The first differential pair includes n-channel transistors 50, 52 and 54, where transistor 50 is coupled to VDD through common load resistor R1, and to VSS through transistor 54. Transistor 52 is coupled to VDD through common load resistor R2, and to VSS through transistor 54. The gates of transistors 50 and 52 receive complementary up conversion frequency signals z and z* respectively, while the gate of transistor 54 receives one phase of input baseband signal IN.

The second differential pair includes n-channel transistors 56, 58 and 60, where transistor 58 is coupled to VDD through common load resistor R2, and to VSS through transistor 60. Transistor 56 is coupled to VDD through common load resistor R1, and to VSS through transistor 60. The gates of transistors 56 and 58 receive complementary up conversion frequency signals z* and z respectively, while the gate of transistor 60 receives the opposite phase of the input baseband signal, labelled IN*. The operation of up conversion circuit 30 is well known to those of skill in the art. The circuit multiplies the baseband input signal IN/IN* with the up conversion frequency z/z* to provide corresponding output signals OUT and OUT*. The first differential pair drives output signal OUT while the second differential pair drives opposite phase output signal OUT*.

FIG. 4 is an example circuit schematic of the variable gain circuit 32 shown in FIG. 2, implemented in CMOS technology. It is noted that the circuit of FIG. 4 is configured for differential signals, and the circuit of FIG. 2 is a simplified schematic representing the differential signal configuration. The variable gain circuit includes two differential pair circuits, similar to the ones shown in FIG. 3. The first differential pair includes n-channel transistors 70, 72 and 74, where transistor 70 is coupled directly to VDD, and to VSS through transistor 74. Transistor 72 is coupled to VDD through load resistor R3, and to VSS through transistor 74. The gates of transistors 70 and 72 receive differential gain control voltage V_GAIN− and V_GAIN+ respectively, while the gate of transistor 74 receives signal OUT* from up conversion circuit 30 of FIG. 3. It is noted that OUT* in FIG. 3 can be coupled as in FIG. 4.

The second differential pair includes n-channel transistors 76, 78 and 80, where transistor 76 is coupled directly to VDD, and to VSS through transistor 80. Transistor 78 is coupled to VDD through load resistor R4, and to VSS through transistor 80. The gates of transistors 76 and 78 receive differential gain control voltage V_GAIN− and V_GAIN+ respectively, while the gate of transistor 80 receives signal OUT from up conversion circuit 30 of FIG. 3. It is noted that OUT in FIG. 3 can be coupled as in FIG. 4.

The operation of variable gain circuit 32 is well known to those of skill in the art. Maximum gain of signals OUT* and OUT is obtained when V_GAIN+ is at a maximum voltage level, and minimum gain of signals OUT* and OUT is obtained when V_GAIN+ is at a minimum voltage level. The first differential pair drives output signal Vpin+ from a corresponding output pad, while the second differential pair drives opposite phase output signal Vpin− from another corresponding output pad. These output pads correspond to output pad 36 shown in FIG. 2.

Ideally, baseband signal IN/IN* is unconverted and amplified linearly and with minimum noise as output signals Vpin+/Vpin− such that they can meet the minimum requirements for one or more of the previously mentioned communication standards. Unfortunately, the CMOS variable gain circuit 32 does not exhibit a substantially linear characteristic between gain and the input control voltage VCONT, which is equal to V_GAIN+-V_GAIN−. In fact, CMOS transistors in general do not exhibit substantially linear voltage-current characteristics. It is for this reason that AGC circuit 34 must be included to compensate for any introduced signal non-linearities due to the inherent non-linearity of CMOS transistors. Those of skill in the art will further understand that the non-linearity of CMOS transistors can be further complicated by PVT (process, voltage, temperature) variations. Those of skill in the art will appreciate that any one of these variants can affect the operating characteristics of transistor devices, and ultimately, the gain characteristics of the circuit.

Of the PVT variants described, process and voltage are generally static variants that typically do not change during operation of the wireless device. Temperature on the other hand, can change significantly during normal operation of the wireless device. FIG. 5 is a graph illustrating example gain responses of a variable gain circuit as a function of control voltage VCONT for different operating temperatures. Curves 90, 92 and 94 are the gain-VCONT relationships at 85, 22.5 and −40 degrees Celcius, respectively. While all three curves are substantially linear, the variance with temperature, and therefore overall linearity of the variable gain circuit, is not achieved since the amount of gain can vary by as much as 20 dB for a given VCONT value.

There are various techniques and corresponding gain control circuit implementations for AGC 34 that are known in the art for ensuring that actual gain of the variable gain circuit 32 follows a linear relationship with the control voltage VCONT. Commonly owned U.S. application Ser. No. 11/092,566, which is incorporated by reference, discloses a digital system for gain control by monitoring any one of temperature, supply voltage and process parameters, and generating a corresponding compensated gain control voltage for a variable gain circuit. Persons skilled in the art will understand that the above-described AGC system represents one possible technique for correcting/compensating for the inherent non-linear properties of CMOS circuits. Other possible AGC systems can include feedback systems or systems that employ reference circuits.

While the previously discussed AGC circuit effectively establishes a substantially linear relationship between the gain control signal VCONT and the actual gain from variable gain circuit 32, the effective range is limited to about 40 dB. This is sufficient for standards such as GSM and EDGE, but standards such as WCDMA require a higher minimum range of about 85 dB. Therefore, any wireless core employing such an AGC circuit will not meet the WCDMA standard. This is mainly due to the inherent non-linear behaviour of CMOS transistors operating in a saturation mode.

Those of skill in the art will understand that CMOS circuits, such as the variable gain circuit 32, are typically operated in the saturation mode. Although the saturated transistor operates as an ideal current source, it will have a non-linear relationship between its drain current (Id) and its gate-source voltage (Vgs). Furthermore, to keep the transistor operating in the saturation mode, the transistor drain-source voltage (Vds) must be greater than or equal to Vgs-Vt, where Vt is the threshold voltage of the transistor. Hence voltage headroom is reduced, which can lead to clipping of the input signal.

In addition to standards specifying gain characteristics, there are standards governing the maximum amount of allowable noise in the resulting unconverted and amplified signal. Unfortunately, the circuit of FIG. 2 requires the addition of SAW filter 38 to remove unwanted noise from the signal that is generated within up conversion circuit 30, variable gain circuit 32, and even from AGC circuit 34.

With reference to the circuit schematics of FIG. 3 and FIG. 4, noise is introduced in each current to voltage and voltage to current conversion stage of the circuits. Starting in the up conversion circuit 30 of FIG. 3, signals IN/IN* are voltage signals switching transistors 54 and 60 on and off to generate currents through transistors 50, 52, 56 and 58. These currents are then converted to voltage signals OUT/OUT* and provided to the variable gain circuit 34. At the variable gain circuit 32, voltage signals OUT/OUT* switch transistors 74 and 80 on and off to generate signal currents through transistors 72 and 78. These currents are then converted to voltage signals Vpin+/Vpin−. Each voltage to current and current to voltage conversion stage will introduce noise into the resulting output signals Vpin+/Vpin−. In addition to noise, the numerous voltage to current and current to voltage conversion stages will consume current and therefore waste power, which is a limited resource in mobile wireless devices.

CMOS transmitter circuits, especially up conversion circuits, variable gain circuits, and automatic gain circuits are less costly to manufacture than their more exotic bipolar counterparts. While the inherent non-linearity of CMOS variable gain circuits can be compensated/corrected with existing circuits, they are limited to a 40 dB range that is insufficient for WCDMA standards. Furthermore, the noise added by the mixer circuit and the variable gain circuit necessitates an off-chip SAW filter discrete component, potentially increasing the wireless device form factor and cost due to the additional device.

It is, therefore, desirable to provide a CMOS transmitter with a gain system for providing a high range of gain and linear operation, while minimizing noise.

SUMMARY OF THE INVENTION

It is an object of the present invention to obviate or mitigate at least one disadvantage of the prior art. In particular, it is an object of the present invention to provide CMOS transmitter circuits that maintain a linear relationship between desired gain and the resulting gain in an amplified signal, while minimizing noise.

In a first aspect, the present invention provides a merged mixer and variable gain amplifier circuit. The merged mixer and variable gain amplifier circuit includes a mixer sub-circuit and a variable gain sub-circuit. The mixer sub-circuit multiplies differential input currents with a complementary frequency signal for providing upconverted differential signals. The variable gain sub-circuit has gain transistors for passing the upconverted differential signals with a gain corresponding to a gain control voltage, as amplified differential signals. The gain transistors operate in sub-threshold, and the gain control voltage is generated by a linearizer circuit receiving a temperature compensated voltage. The gain control voltage preferably has a characteristic defined by $-\ln(1+e^{(-V\_COMP/\phi)})$, where V_COMP is the temperature compensated voltage, and $\phi$ is a constant kT/q for transistors of the linearizer circuit.

In an embodiment of the present aspect, the mixer sub-circuit can include a first differential pair circuit and a second differential pair circuit. The first differential pair circuit alternately passes one of the differential input currents to a first mixer output and a second mixer output at a frequency corresponding to the complementary frequency signal. The second differential pair circuit alternately passes the other of the differential input currents to the first mixer output and the second mixer output at the frequency corresponding to the complementary frequency signal. The first differential pair circuit can include first, second, third and fourth n-channel transistors. The first n-channel transistor has a source terminal for receiving the one of the differential input currents, a gate terminal for receiving one phase of the complementary frequency signal, and a drain terminal connected to the first mixer output. The second n-channel transistor has a source terminal for receiving the one of the differential input currents, a gate terminal for receiving another phase of the complementary frequency signal, and a drain terminal connected to the second mixer output. The third n-channel transistor has a source terminal for receiving the other of the differential input currents, a gate terminal for receiving the one phase of the complementary frequency signal, and a drain terminal connected to the second mixer output. The fourth n-channel transistor has a source terminal for receiving the other of the differential input currents, a gate terminal for receiving the other phase of the complementary frequency signal, and a drain terminal connected to the first mixer output.

In another embodiment of the present aspect, the variable gain sub-circuit can include a first differential pair circuit and a second differential pair circuit. The first differential pair circuit has a first input node for receiving one of the upconverted differential signals and a first output node for providing one of the amplified differential signals. The second differential pair circuit has a second input node for receiving the other of the upconverted differential signals and a second output node for providing the other of the amplified differential signals. The first differential pair circuit includes first and second gain transistors having a common source terminal connected to the first input node for receiving the one of the upconverted differential signals and a first load resistor serially connected between a power supply and a drain terminal of the first gain transistor. The first output node is located between the first load resistor and the first gain transistor and the power supply is connected to a drain terminal of the second gain transistor. The second differential pair includes third and fourth gain transistors having a common source terminal connected to the second input node for receiving the other of the upconverted differential signals, and a second load resistor serially connected between the power supply and a drain terminal of the third gain transistor. The second output node is located between the second load resistor and the third gain transistor and the power supply is connected to a drain terminal of the fourth gain transistor. Preferably, the first, second, third and fourth gain transistors are n-channel transistors operating in sub-threshold.

In yet another embodiment of the present aspect, the differential input currents are linear, and the merged mixer and variable gain amplifier circuit further includes a current source circuit. The current source circuit includes a voltage to current circuit and a noise reducing circuit. The voltage to current circuit converts complementary input voltage signals into corresponding current signals having noise components. The noise reducing circuit receives the corresponding current signals and filters out substantially all the noise components. The differential input currents are generated by the noise reducing circuit. The noise reducing circuit includes current to voltage converters, low pass filters and voltage to current converters. The current to voltage converters convert the corresponding current signals into voltage signals. The low pass filters receive the voltage signals and provide noise reduced voltage signals. The voltage to current converters receive the noise reduced voltage signals, and generate the differential input currents in response to the noise reduced voltage signals.

According to an aspect of the present embodiment, the current to voltage converters can include a pair of diode-connected n-channel transistors, the voltage signals being provided from gate terminals of the pair of diode-connected n-channel transistors. The voltage to current converters can include a pair of n-channel drive transistors having gate terminals for receiving the noise reduced voltage signals. The low pass filters can include resistors connected in series between the gate terminals of the pair of diode-connected n-channel transistors and the n-channel drive transistors, and capacitors connected in parallel with the gate terminals of the n-channel drive transistors.

In a second aspect, the present invention provides a method for controlling signal transmission gain in response to an input control signal. The method includes receiving the input control signal; generating in response to temperature, a temperature compensated control voltage corresponding to the input control signal; linearizing the temperature compensated control voltage for generating a gain control voltage; and controlling a gain circuit in sub-threshold in response to the gain control voltage.

In embodiments of the present aspect, the input control signal is a voltage signal and the voltage signal is provided by a digital to analog converter. The input control signal can be a voltage signal, and the step of generating includes converting the voltage signal into a current and converting the current into an intermediate voltage signal. The temperature compensated control voltage is generated from the intermediate voltage signal. The current can be filtered or an effective input control voltage range corresponding to the current can be shifted.

In another embodiment of the present aspect, the gain control voltage linearly controls the gain circuit. In this embodiment, the gain control voltage is generated by a linearizer circuit, which has a characteristic defined by $-\ln(1+e^{(-V\_COMP/\phi)})$, where V_COMP is the temperature compensated control voltage, and $\phi$ is a constant kT/q for transistors of the linearizer circuit.

In a third aspect, the present invention provides a gain system for generating a transmission signal in response to an input control signal. The gain system includes a proportional to absolute temperature (PTAT) circuit, a voltage converter, a linearizer circuit, and a variable gain circuit. The proportional to absolute temperature (PTAT) circuit has temperature dependent components configured for generating a temperature dependent current. The voltage converter receives the temperature dependent current as a supply for converting the input control signal to a temperature compensated control voltage. The linearizer circuit has first input transistors for receiving the temperature compensated control voltage. The linearizer circuit preconditions the temperature compensated voltage by generating a gain signal characterized by $-\ln(1+e^{(-V\_COMP/\phi)})$, where V_COMP is the temperature compensated voltage, and $\phi$ is a constant kT/q for the first input transistors. The variable gain circuit has second input transistors operating in a sub-threshold region for receiving the gain signal and for providing an amplified signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a CMOS automatic gain control (AGC) circuit that receives an analog control voltage and generates a temperature compensated gain voltage to linearly control the gain of a variable gain circuit operating in the sub-threshold region. A PTAT circuit having a resistor network coupled to a current mirror circuit operating in the sub-threshold region establishes a current having an proportional relationship to temperature. This current is used as a supply for a voltage to voltage converter circuit, which generates an intermediate voltage in response to the analog control voltage. A linearizing circuit operating in the sub-threshold region pre-conditions the intermediate voltage, which is then applied to a variable gain circuit. The variable gain circuit is operated in the sub-threshold region, and the preconditioned intermediate voltage will control the amount of gain to be substantially linear with respect to the analog control voltage, and with a range of about 45 dB. If two gain stages are connected, a total range of 90 dB is achieved.

According to another embodiment of the present invention, the variable gain circuit operated in the sub-threshold region can be merged with the up conversion circuit to reduce the number of voltage to current and current to voltage conversion stages. Hence the amount of noise generated during their operation can be reduced. This can be done because the Vds of the sub-threshold transistors no longer have to maintain the relationship Vds>Vgs−Vt, which is required for operation in the saturation region. Therefore, minimal voltage supply headroom is consumed. Furthermore, the current source of the mixer circuit can be configured to include an on-chip low pass filter to remove out of band noise, which is sufficient to render the external filter device unnecessary.

Figure 4:
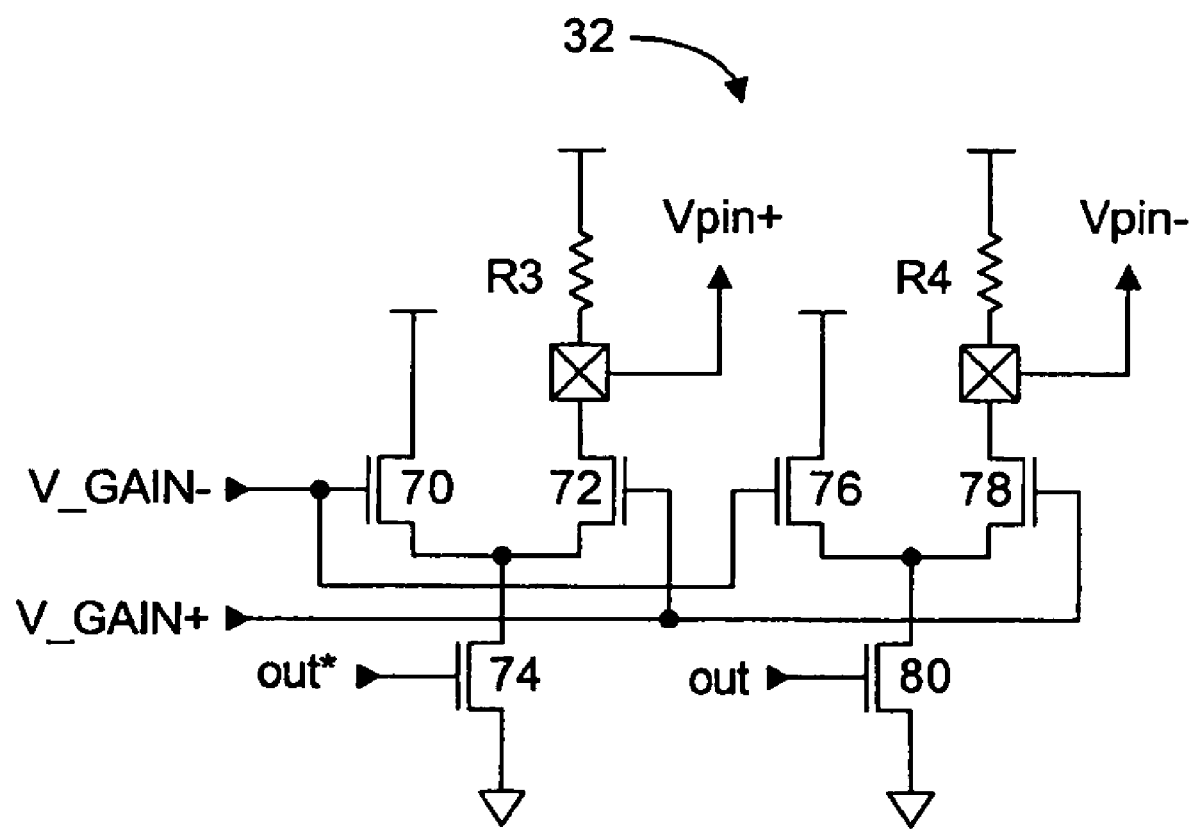
FIG. 4 is a circuit schematic of a CMOS gain circuit of the prior art.
Figure 5:
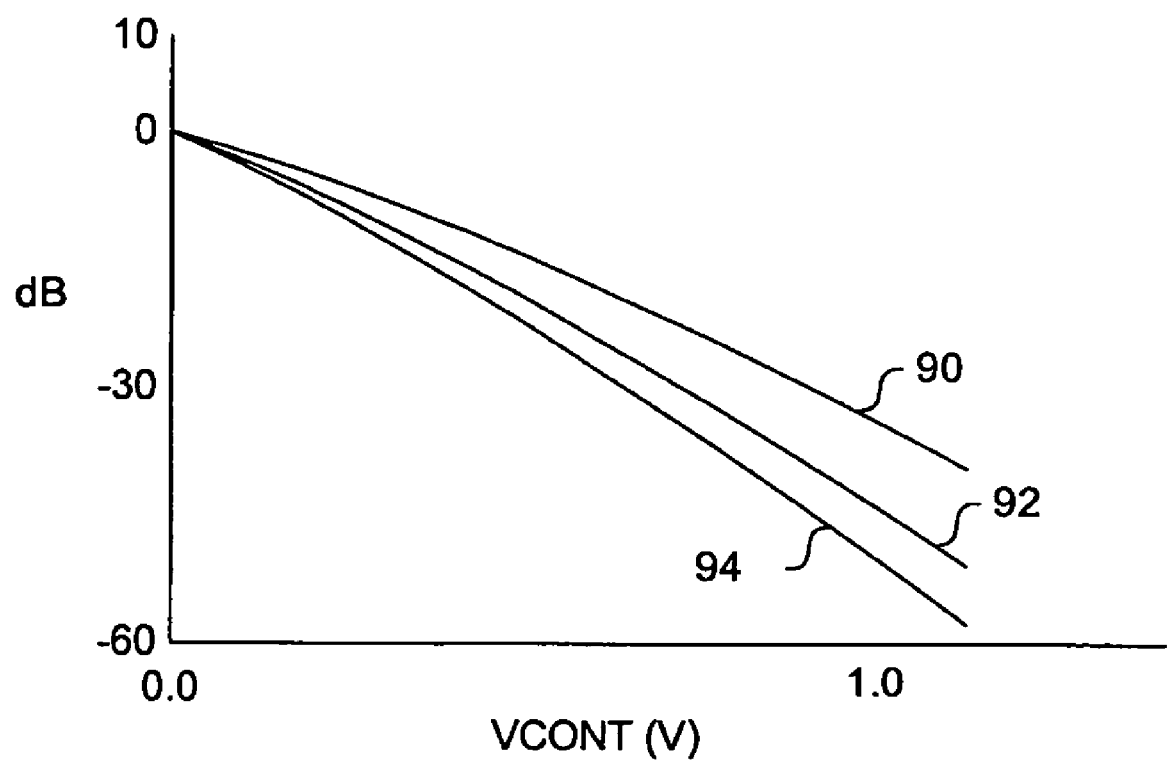
FIG. 5 is a plot of gain versus gain control voltage for different operating temperatures.

As will be described later, CMOS variable gain circuits such as the circuits shown in FIG. 4, are biased to operate in a sub-threshold region. Those of skill in the art will understand that a CMOS n-channel transistor operates in the sub-threshold region when Vgs<Vtn, where Vtn is the threshold voltage of the n-channel transistor. While a drain current will flow through the transistor in sub-threshold operation, this drain current will be exponentially related to Vgs. This characteristic is similar to the collector current and base/emitter voltage of a BJT transistor. This characteristic is very advantageous for gain circuit applications because a linear gain relationship to an input control voltage can be inherently obtained. This relationship is shown in equation 1 below:

$$Id = \text{Const} \times e^{qVgs/kTN}, \quad (1)$$

where Const and N are constants, k is Boltzmann's constant, q is electronic charge, T is temperature in Kelvin, and N is a slope parameter.

Using the first differential pair of variable gain circuit 32 shown in FIG. 4 by example, if transistors 70 and 72 are in sub-threshold, the resulting linear gain is characterized by equation 2 below:

$$G = (I_{72}/I_{74})dc = 1/(1+e^{(-V\_GAIN/nVt)}), \quad (2)$$

where G is gain, $I_{72}$ is the dc current through transistor 72, $I_{74}$ is the dc current through transistor 74, n is a constant of the transistor and Vt is the threshold voltage. Equation 2 expressed in dB appears in equation 3 below:

$$GdB = -\ln(1+e^{(-V\_GAIN/nVt)}) \quad (3)$$

As shown in equation (1), the sub-threshold drain current has an undesired temperature dependency. As shown in equation (3), the "1" term adversely impacts the linearity of the gain circuit. Therefore, the gain control circuit of the present invention will compensate for the temperature dependency of the variable gain circuit, and generate an offset term to cancel the "1" in equation (3).

Figure 6:
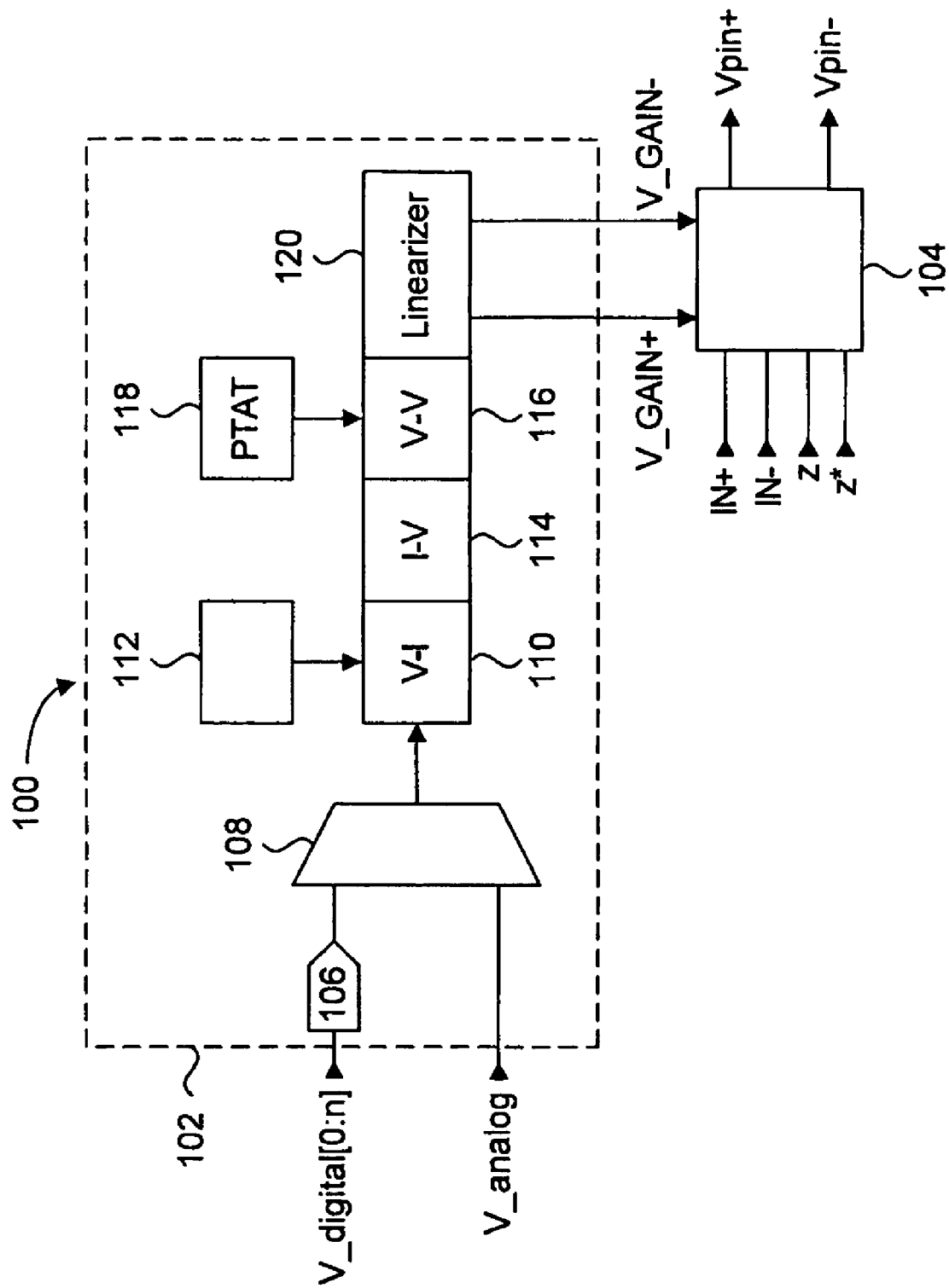
FIG. 6 is a block diagram of a low noise CMOS gain control circuit according to an embodiment of the present invention.

A gain system according to an embodiment of the present invention is shown in FIG. 6. Gain system 100 is preferably implemented in the transmitter core of a wireless device, and more specifically can replace components 30, 32 and 34 of FIG. 2. The gain system 100 includes a gain control circuit 102 and a variable gain circuit 104. The gain control circuit 102 receives an input control voltage and generates differential corresponding gain signals V_GAIN+/V_GAIN− for controlling the gain of variable gain circuit 104. Variable gain circuit 104 can optionally include separate up conversion and gain circuits, or a merged up conversion and variable gain circuit according to an embodiment of the present invention to be discussed later. The variable gain circuit 104 receives the differential baseband signal IN+/IN− to be transmitted, up converts them to frequency signal z/z*, and generates differential output signals Vpin+/Vpin− for downstream circuits such as the driver circuit 40 shown in FIG. 2.

A more detailed description of gain control circuit 102 now follows. In the presently shown embodiment of FIG. 6, gain control circuit 102 includes a digital to analog converter (DAC) 106, multiplexer circuit 108, a voltage to current converter circuit 110, a current control circuit 112, a current to voltage circuit 114, a voltage converter circuit 116, a PTAT circuit 118, and a linearizer circuit 120.

Multiplexor circuit 108 selectively couples one of two input control voltage signals to the voltage to current converter circuit 110. The first signal can be an analog voltage V_analog from a pin of the chip, and the second signal can be a digital signal V_digital[0:n] converted to an analog voltage via DAC 106. V_digital[0:n] can be provided by the base band processor or other digital source, and can be n-bits wide to match the resolution of the DAC 106.

Voltage to current converter circuit 110 is a standard well-known circuit for converting the input voltage from multiplexor circuit 108 into current. The purpose of converting the input voltage to current is to facilitate manipulation of the signal by current control circuit 112. Those of skill in the art will understand that it is easier to manipulate current than voltage. Examples of current manipulation can include filtering, shifting effective input control voltage range, and current sensitivity to input control voltage by adjusting the current to input control voltage slope characteristic.

The resulting current is then converted back to a corresponding voltage by current to voltage circuit 114, in preparation for the temperature dependency adjustment of the following circuit blocks. According to an alternate embodiment of the present invention, circuits 110, 112 and 114 can be omitted such that the input control voltage is coupled directly to voltage converter circuit 116.

The conditioned voltage from current to voltage circuit 114 is then processed by voltage converter circuit 116 to generate a voltage that is a function of temperature. To establish the temperature dependence of the resulting voltage, called a temperature compensated voltage, the PTAT circuit 118 is used. The PTAT circuit 118 generates a current that is proportional to temperature that is used by the voltage converter circuit 116 as a supply for its circuit components.

The temperature compensated voltage is then further conditioned by linearizer circuit 120 to generate gain signals V_GAIN+/V_GAIN−. In particular, linearizer circuit 120 adds a negative offset to the gain signals that will cancel a positive offset generated by the variable gain circuit 104, thus ensuring substantially linear operation that is independent of temperature.

DAC circuit 106, multiplexor 108, voltage to current converter 110, and current control circuit 112 are optional circuits for the presently described embodiments of the invention, but are also standard circuits known in the art. While current control circuit 112 may not be standardized, the various known circuit techniques can be used to manipulate the current as desired.

Figure 7:
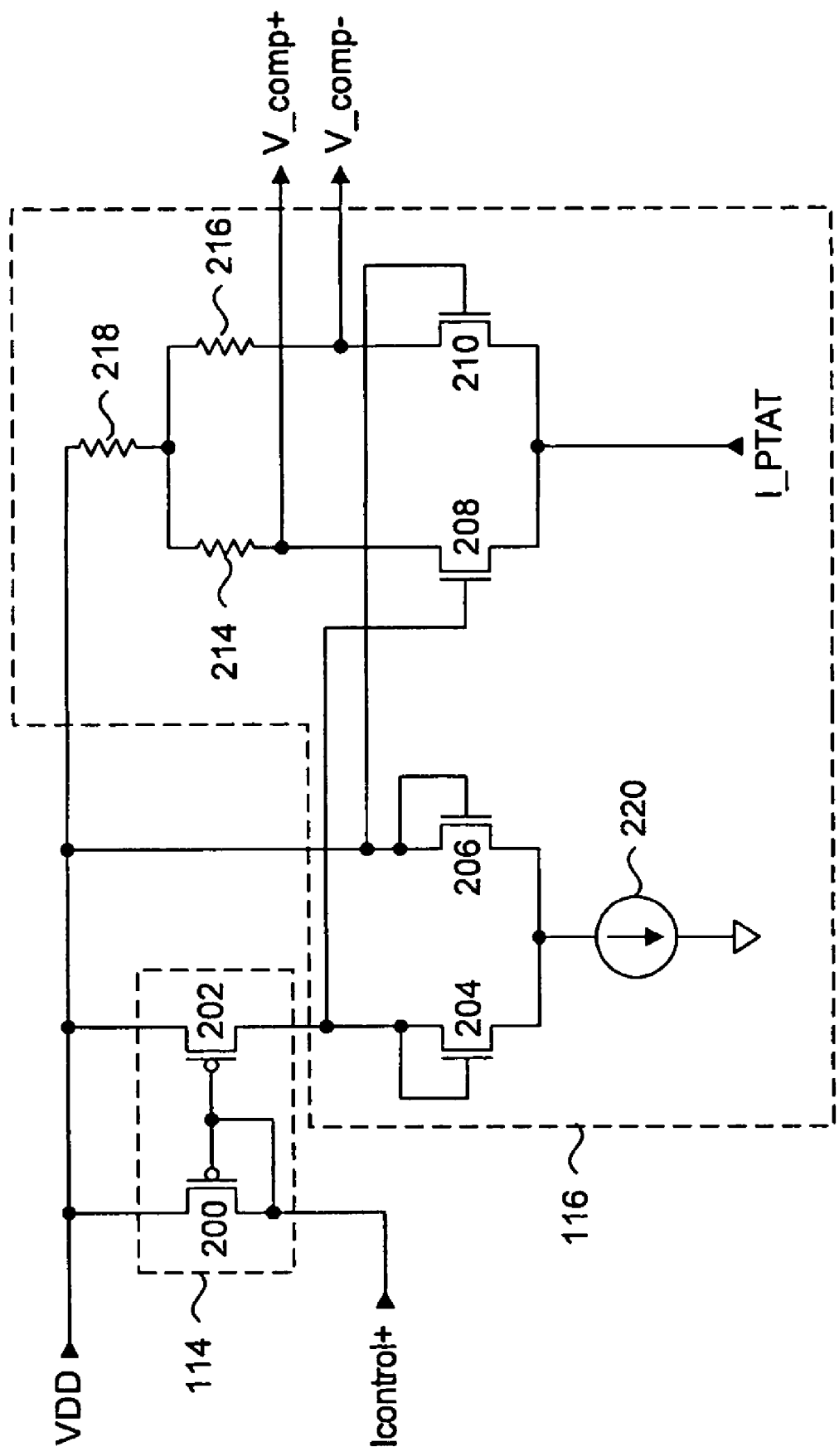
FIG. 7 is a circuit schematic of the voltage to voltage converter circuit shown in FIG. 6, according to an embodiment of the present invention.

Following is a description of the voltage converter circuits 114 and 116, having a circuit configuration shown in FIG. 7. Voltage converter circuits 114 and 116 includes a current mirror pair consisting of p-channel transistors 200 and 202, diode connected n-channel transistors 204 and 206, and differential circuit consisting of n-channel transistors 208 and 210 coupled to load resistors 214, 216 and 218. Preferably, resistors 214, 216 and 218 are equal in value. Diode connected n-channel transistor 204 forms a current mirror pair with transistor 208, and similarly, diode connected n-channel transistor 206 forms a current mirror pair with transistor 210. The presently shown circuit is one example of a well known circuit that can be used for voltage converter circuits 114 and 116.

Transistor 200 has source/drain terminals connected between VDD and input control current Icontrol+ provided by voltage to current converter circuit 110, while transistors 202 and 204 are serially connected between VDD and current source 220 Transistor 206 has source/drain terminals connected to VDD and current source 220-. A common terminal of load resistors 214 and 216 is coupled to VDD via resistor 218, while the other terminal of load resistors 214 and 216 is connected to transistors 208 and 210 respectively. Temperature compensated voltage signals V_comp+/V_comp− are generated from the drain terminals of transistors 208 and 210, while their common source terminals are coupled to receive PTAT current.

In general operation, voltage converter 116 generates the temperature compensated voltage signals V_comp+/V_comp− from Icontrol+ by steering current differently through transistors 204 and 206 by virtue of the current mirror transistors 200 and 202 coupled to transistor 204. Accordingly, the gates of transistors 208 and 210 are biased differently, thereby tailoring the current through transistors 208 and 210. V_comp+ and V_comp− will then be set to different voltage levels. The temperature compensation circuit sets the current through transistors 208 and 210 via current I_PTAT.

Transistors 200, 202, 204 and 206 effectively function as a current to voltage converter, for converting Icontrol+ into two differential voltages V_COMP+ and V_COMP−. Then the differential pair circuit of transistors 208, 210 and 212 effectively function as a current to voltage converter, for converting the currents into a differential voltage that is related to temperature.

Figure 8:
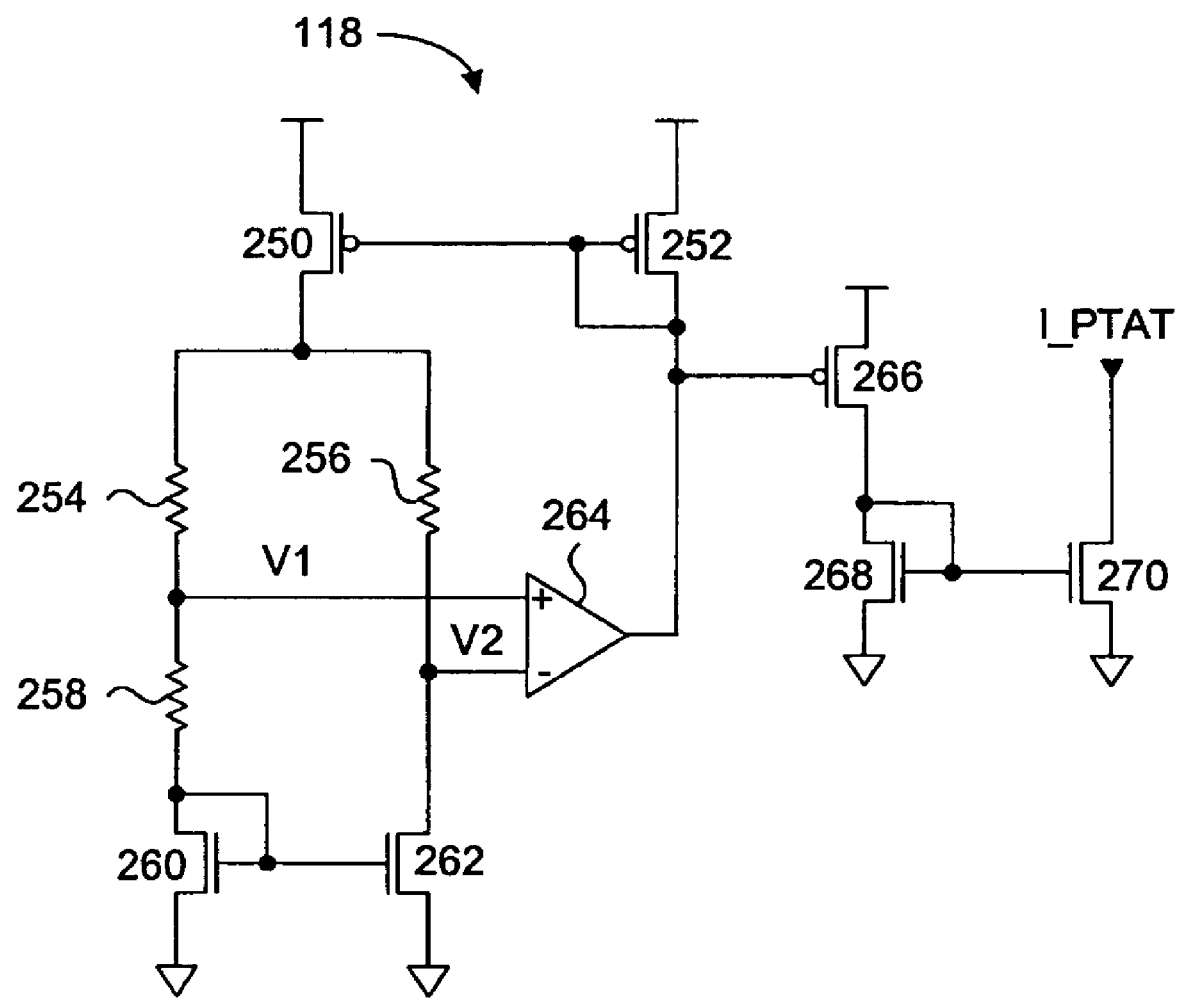
FIG. 8 is a circuit schematic of the PTAT circuit shown in FIG. 6, according to an embodiment of the present invention.

Generating the current supply I_comp is the PTAT (proportional to absolute temperature) circuit 118. The PTAT circuit 118 shown in FIG. 8 includes p-channel transistors 250, 252, resistors 254, 256 and 258, n-channel transistors 260, 262, op-amp 264, p-channel transistor 266, and n-channel current mirror transistors 268 and 270. Transistors 250 and 252 are arranged in a current mirror configuration, and have their drain terminals connected to Vdd. Transistor 250 supplies current to a voltage divider network consisting of a pair of parallel voltage divider branches, where the first branch includes resistors 254, 258, and transistor 260 serially connected between the source terminal of transistor 250 and Vss. The second branch includes resistor 256 and transistor 262 serially connected between the source terminal of transistor 250 and Vss. Transistors 260 and 262 are arranged in a current mirror configuration and operate in the sub-threshold mode. Op-amp 264 has a positive input terminal connected to the common terminal of resistors 254 and 258 (node V1), and a negative/reference input terminal connected to the common terminal of resistor 256 and transistor 262 (node V2). The output of op-amp 264 is connected to the source of transistor 252 and to the gate of drive transistor 266. Drive transistor 266 has drain terminal connected to Vdd and a source terminal connected to diode connected transistor 268. Since transistors 268 and 270 are connected in a current mirror configuration, the current through transistor 270 will be the same as the current through transistor 268, provided they are similarly sized. This current is I_PTAT used in voltage converter circuit 116.

The aforementioned components of PTAT circuit 118 can be functionally grouped as follows. A voltage divider network consisting of the first and second voltage divider branches generates temperature dependent voltages V1 and V2, that may differ depending on the selected values for resistors 254, 256 and 258. Preferably, the ratio of the values of resistors 254 and 258 (254/258) is limited to 3 or 4, while the values of resistors 254 and 256 are equal to each other. These temperature dependent voltages are received by a current generator circuit consisting of op-amp 264, and transistors 250, 252 and 266. The voltage output of op-amp 264 will control the feedback current provided by controlled current source 250 to supply the voltage divider network, and the current provided by controlled current source 266. The voltage output of op-amp 264 is related to temperature, as are the currents provided by current sources 250 and 266.

In general operation, the values of resistors 254, 256 and 258 are selected to maintain transistors 260 and 262 in the sub-threshold region of operation, while op-amp 264 maintains V1=V2 through the feedback of its output to transistor 252, thereby controlling the current through transistor 250. Because transistors 260 and 262 are kept in the sub-threshold region of operation, they will exhibit the previously discussed exponential relationship between current and temperature. Therefore, the output current I_PTAT will be proportional to temperature.

Figure 9:
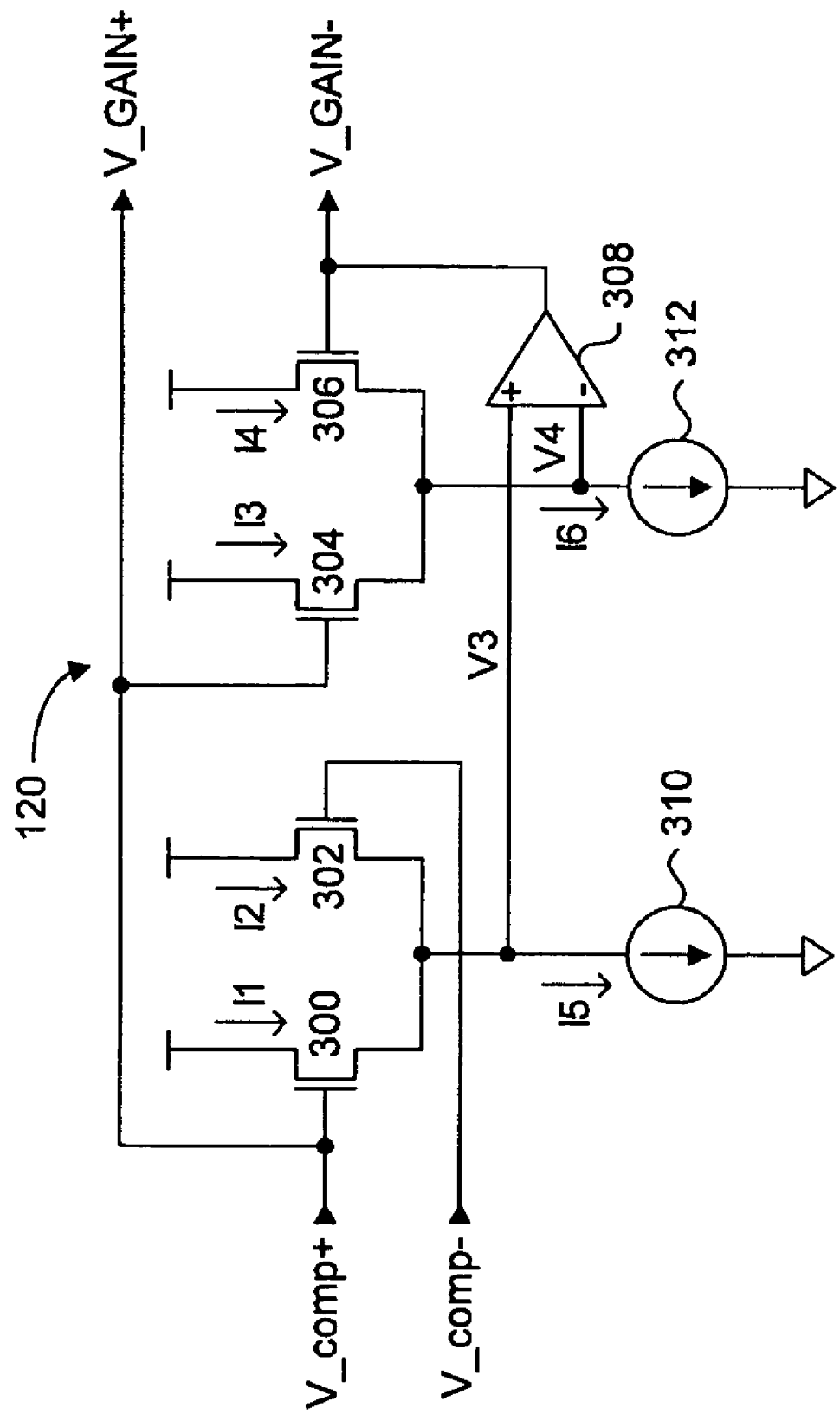
FIG. 9 is a circuit schematic of the linearizer circuit shown in FIG. 6, according to an embodiment of the present invention.

FIG. 9 is a circuit schematic of the linearizer circuit 120 shown in FIG. 6. Linearizer circuit 120 receives temperature compensated voltage signals V_comp+/V_comp-, and is responsible for pre-conditioning the signals such that control of the variable gain circuit is substantially linear. More specifically, the function of linearizer circuit 120 is to offset or cancel the "1" term in previously shown equation (3) for the variable gain circuit.

The linearizer circuit 120 includes n-channel transistors 300, 302, 304 and 306, op-amp circuit 308 and current sources 310 and 312. Transistors 300 and 302 form a first differential pair while transistors 304 and 306 form a second differential pair. The gates of transistors 300 and 304 receive V_comp+ and only the gate of transistor 302 receives V_comp-. The gate of transistor 306 receives the output of op-amp circuit 308, which is the output V_GAIN-. The input signal V_comp+ is simply re-labelled V_GAIN+ at the output. Op-amp circuit 308 has a positive input coupled to the common source terminals of transistors 300 and 302 (V3), and a reference input coupled to the common source terminals of transistors 304 and 306 (V4). The drain terminals of transistors 300, 302, 304 and 306 are connected to Vdd, and the current sources are connected to Vss. It is noted that the W/L size of transistors 300, 302 and 306 are the same, but the W/L size of transistor 304 is approximately 2W/L.

In general operation, transistors 300, 302, 304 and 306 operate in the sub-threshold region, and op-amp circuit 308 maintains the voltage at node V4 equal to the voltage at node V3 by adjusting the gate voltage of transistor 306. The relationship of the output voltages V_GAIN relative to the input voltages V_comp is now described with reference to the equations (4) to (12) below. It is noted that the current through transistors 300, 302, 304 and 306 are denoted as currents I1, I2, I3 and I4 respectively, and the current through current sources 310 and 312 are denoted as currents I5 and I6 respectively. The gate-source voltage of transistors 300, 302, 304 and 306 are denoted Vgs1, Vgs2, Vgs3 and Vgs4 respectively.

$$I1+I2=I5 \tag{4}$$

$$I3+I4=I6 \tag{5}$$

where, $I1=\omega e^{Vgs1/\phi}$, $I2=\omega e^{Vgs2/\phi}$, $I3=2\omega e^{Vgs3/\phi}$, $I4=\omega e^{Vgs4/\phi}$, and Vgs1=Vgs3. where $\phi=kT/q$, where k=Boltzmann's constant, T=Temperature in Kelvin, and q=charge $$I1/I2=e^{V\_comp/\phi} \tag{6}$$

$$I3/I4=2e^{V\_GAIN/\phi} \tag{7}$$

From (4) and (6), expression (8) can be obtained.

$$I1=I5e^{V\_comp/\phi}/(1+e^{V\_comp/\phi}) \tag{8}$$

From (5) and (7), expression (9) can be obtained.

$$I4=(I6/2e^{-V\_GAIN/\phi})/(1+1/2xe^{-V\_GAIN/\phi}) \tag{9}$$

If $$I1/I4=e^{V\_GAIN/\phi} \tag{10}$$

and substituting for I1 and I4 in (10) from equations (8) and (9) gives $$\frac{\left(\dfrac{Ie^{V\_comp/\phi}}{1+e^{V\_comp/\phi}}\right)}{\left(\dfrac{\dfrac{I}{2}e^{-V\_GAIN/\phi}}{1+\dfrac{1}{2}e^{-V\_GAIN/\phi}}\right)}=e^{V\_GAIN/\phi} \tag{11}$$

Alternatively, (11) can be summarized as (12) below:

$$\frac{1}{1+e^{-V\_comp/\phi}}=\frac{1}{2+e^{-V\_GAIN/\phi}} \tag{12}$$

where $V\_GAIN=\phi \ln(1+e^{V\_COMP/\phi})$, which is the same as equation (3).

The described gain system 100 of FIG. 6 will convert an analog input control voltage into a temperature compensated, linearized voltage for application to a variable gain amplifier circuit operating in the sub-threshold region. The temperature dependency of the variable gain amplifier circuit is compensated for by the PTAT circuit 118 such that gain is consistently the same for any given input control voltage, regardless of the operating temperature.

Figure 1:
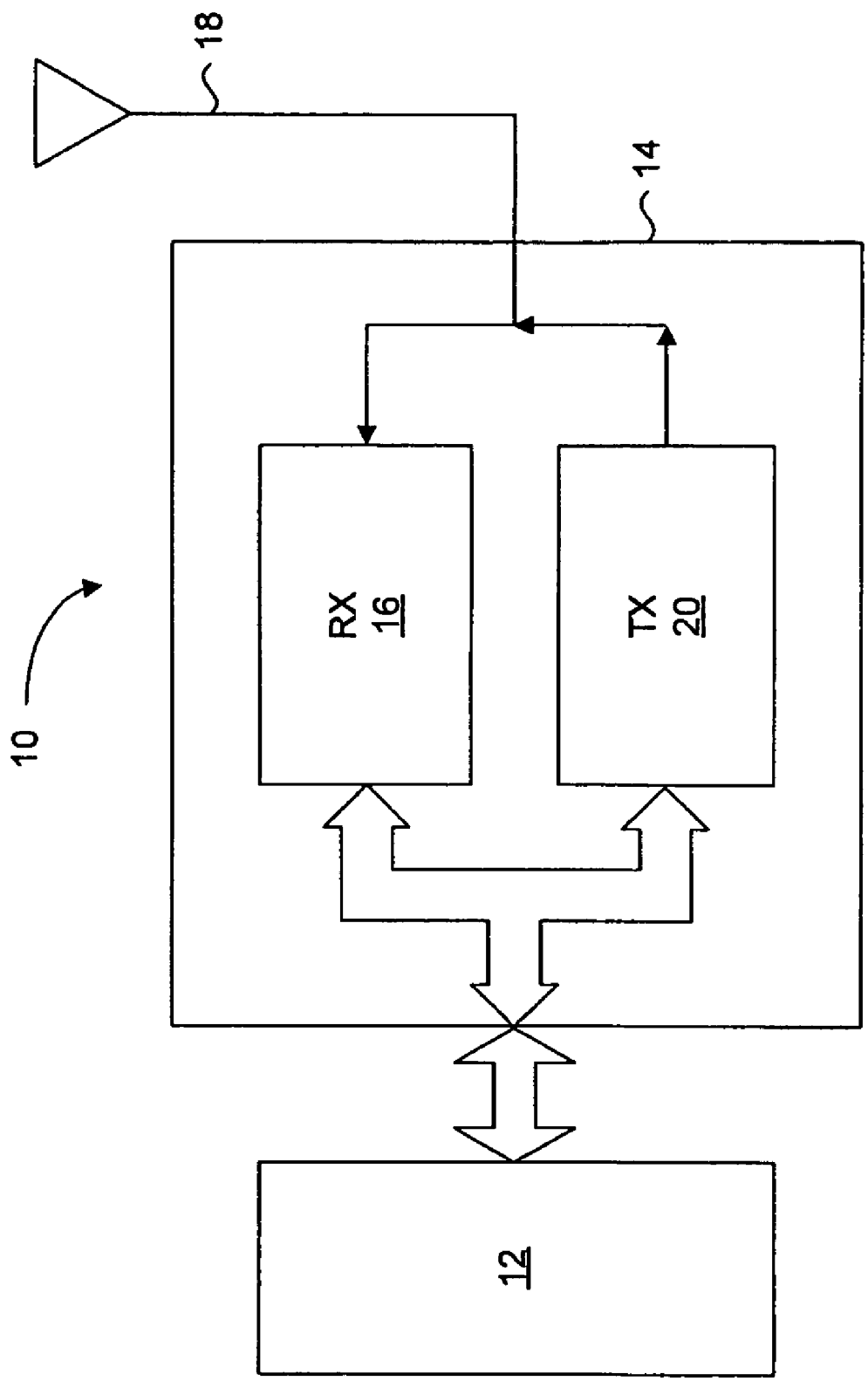
FIG. 1 is a block diagram of a wireless core of the prior art.
Figure 2:
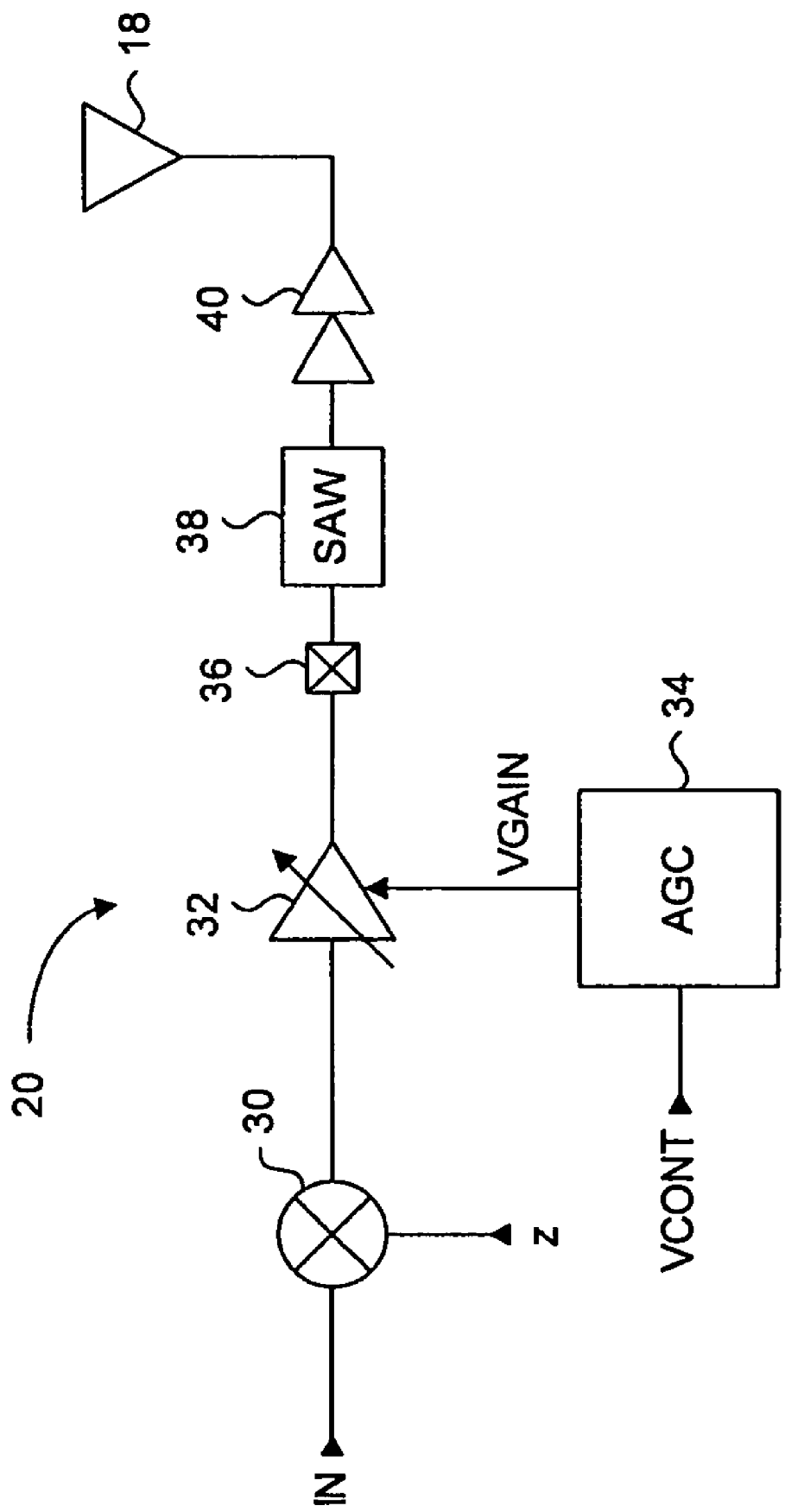
FIG. 2 is a block diagram of transmitter path circuits of the wireless core shown in FIG. 1.

As previously described, the noise introduced by the various voltage to current and current to voltage stages between the separate up conversion circuit 30 and variable gain circuit 32 of the prior art system shown in FIG. 2 can be reduced without the use of an external SAW filter. Because the variable gain circuit of the present invention is operated in the sub-threshold region, the up conversion circuit 30 and the variable gain circuit 32 can be merged together.

Figure 10:
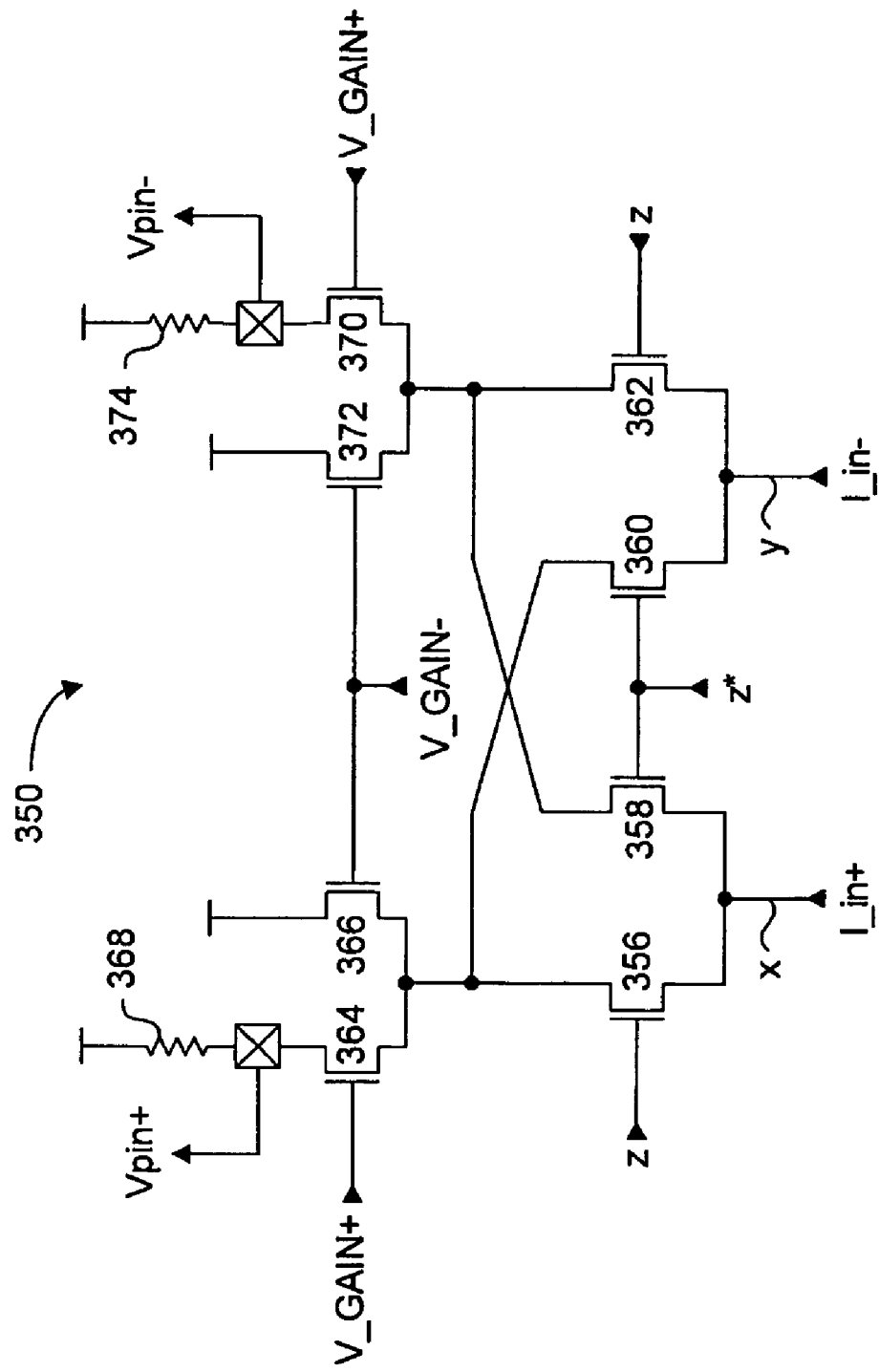
FIG. 10 is a circuit schematic of the merged mixer and VGA circuit shown in FIG. 6, according to an embodiment of the present invention; and, FIG. 11 is a circuit schematic of a linear noise-inhibited current source circuit shown in FIG. 10, according to an embodiment of the present invention.

FIG. 10 is a circuit schematic of a merged up conversion, also known as a mixer, and variable gain amplifier circuit. This circuit will be referred to from this point forward as simply, a merged variable gain circuit. Merged variable gain circuit 350 includes two sub-circuits coupled in sequence. The first sub-circuit is a mixer section for multiplying the differential input currents I_in+/I_in− at nodes x and y with complementary frequency signals z/z*. Differential input currents I_in+/I_in− are generated from input signals IN/IN* shown in FIG. 6. In the present application, the input voltage signals are unconverted to the frequency of the signals z/z*. The second sub-circuit is a variable gain section for amplifying the upconverted signals onto output pins by an amount of gain determined by the voltage level of gain control voltage V_GAIN+/V_GAIN−. Those of skill in the art will understand that two gain stages can be connected together to increase the total range of gain.

As previously mentioned, differential input currents I_in+/I_in− are generated from input signals IN/IN*. Preferably, I_in+ and I_in− are linear signals. As previously discussed, CMOS transistors are inherently non-linear devices. If left uncorrected, distortion of the input signal may result. Hence, the circuit responsible for generating I_in+ and I_in− preferably includes circuitry for compensating input signals IN and IN* to ensure a linear response is obtained from the n-channel transistors in response to input signals IN and IN*. A description of the circuit for generating I_in+ and I_in− follows later with reference to FIG. 11.

Figure 3:
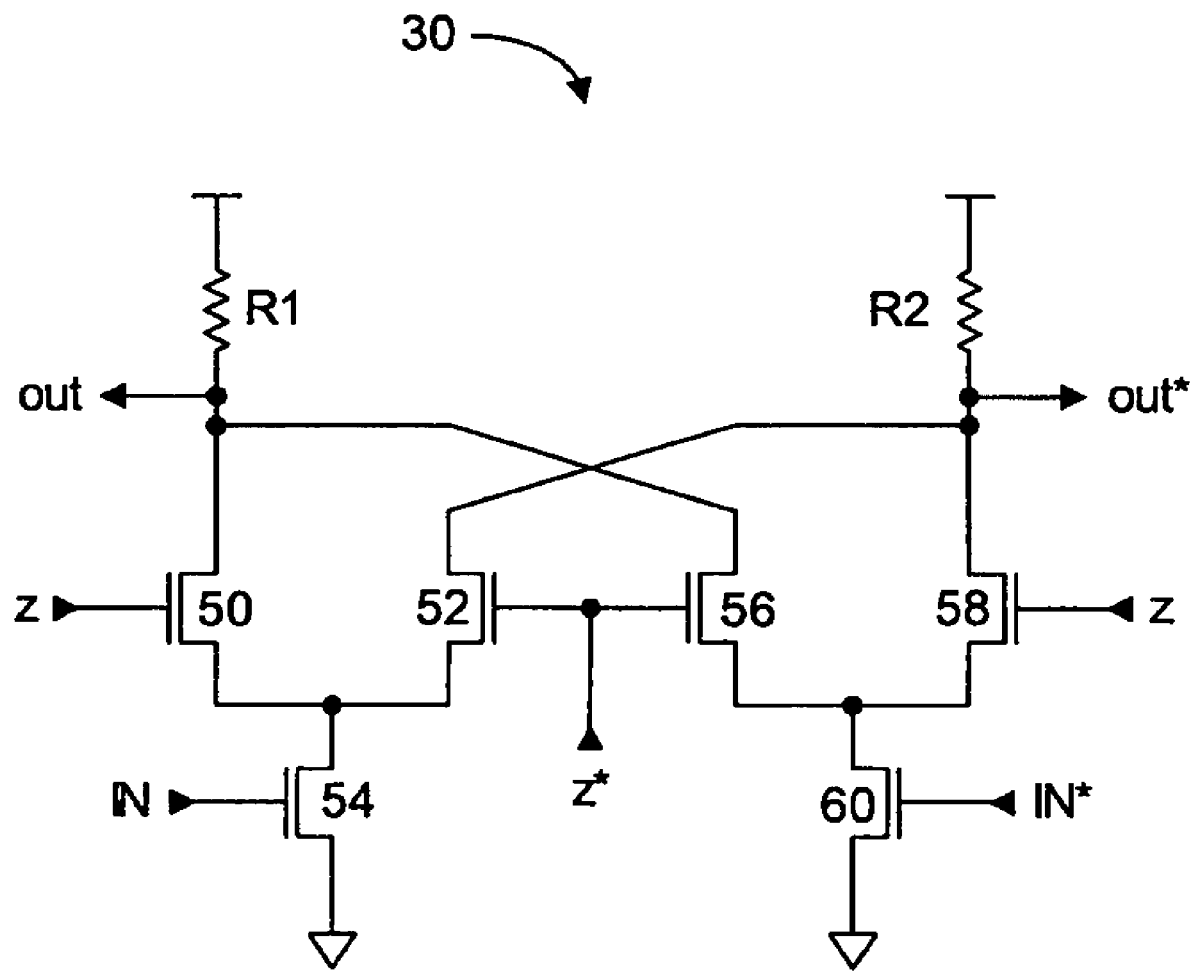
FIG. 3 is a circuit schematic of a CMOS mixer circuit of the prior art.

The first sub-circuit includes dual differential pairs similar to those shown in FIG. 3. The first differential pair includes n-channel transistors 356 and 358, while the second differential pair includes n-channel transistors 360 and 362. The gate terminals of transistors 356 and 362 receive signal z, while the gate terminals of transistors 358 and 360 receive the complement signal z*. The common source terminal of transistors 356 and 358 is coupled to I_in+, and the common source terminal of transistors 360 and 362 is coupled to I_in−. The drain terminal of transistors 356 and 360 are connected together, as are the drain terminals of transistors 358 and 362. The operation of this mixer circuit is similar to that of the circuit presented in FIG. 3.

The second sub-circuit is similar to the variable gain circuit shown in FIG. 4. The variable gain section includes two differential pair circuits. The first differential pair includes n-channel transistors 364 and 366, where transistor 364 is coupled to Vdd through load resistor 368, and transistor 366 is coupled directly to Vdd. The second differential pair includes n-channel transistors 370 and 372, where transistor 370 is coupled to Vdd through load resistor 374, and transistor 366 is coupled directly to Vdd. The gates of transistors 364 and 370 receive gain control voltage V_GAIN+, while the gates of transistors 366 and 372 receive gain control voltage V_GAIN−. The common source terminals of transistors 364 and 366 are connected to the common drain terminals of transistors 356 and 360. The common source terminals of transistors 370 and 372 are connected to the common drain terminals of transistors 358 and 362. The first differential pair drives output signal Vpin+ from an output pad coupled to load resistor 368, and the second differential pair drives opposite phase output signal Vpin− from another output pad coupled to load resistor 374. Transistors 364, 366, 372, 370, all operate in sub-threshold, therefore reducing the amount of head room required.

Merged variable gain circuit 350 minimizes the number of voltage to current and current to voltage conversion stages between receiving an input voltage signal, up converting the input voltage signal, and amplifying the unconverted signal. More specifically, once voltage input signals IN/IN* are converted to current through current source circuits 352 and 354, there is no further conversion of the current back to voltage until the output from the variable gain section. In contrast with the prior art unmerged mixer and variable gain circuits shown in FIGS. 3 and 4, two additional conversion stages are necessary. In FIG. 3, an additional current to voltage conversion stage is required to generate out and out*. In FIG. 4, an additional voltage to current conversion stage is required to generate current from out and out*. Therefore, with the merged variable gain circuit 350, any associated noise generated from these two extraneous conversion stages is removed.

As previously discussed for the first sub-circuit current source circuits 352 and 354, additional circuitry can be included to compensate for the non-linear behaviour of n-channel current source transistors. While effectively linearized, this additional circuitry will add noise to the compensated IN/IN* signals, which is undesirable. According to another embodiment of the present invention, the current source circuits 352 and 354 can include pre-filtering means for reducing this noise. In fact, the noise can be reduced to a level such that SAW filter 38 of FIG. 2 is no longer required.

Figure 11:
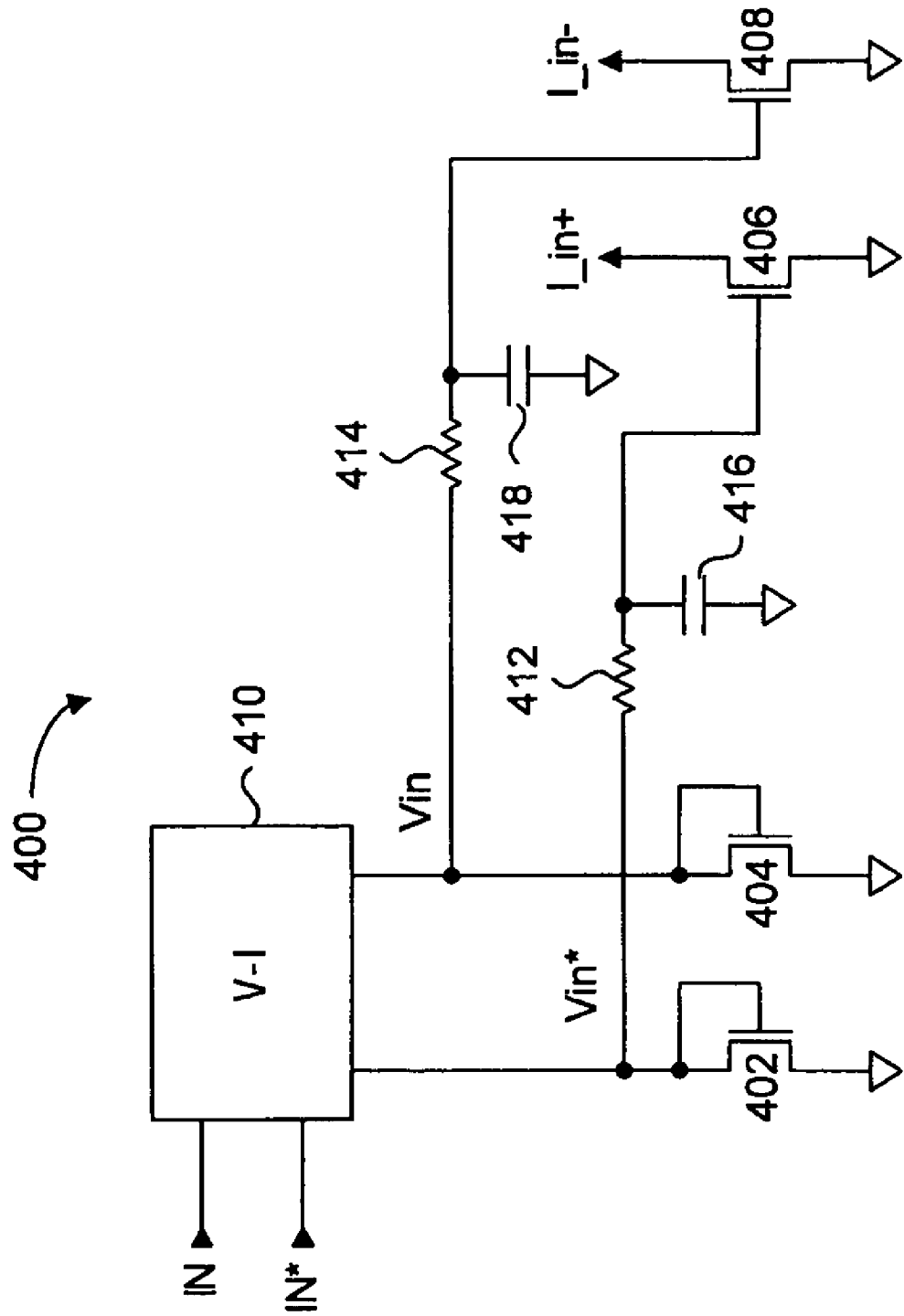

FIG. 11 is a circuit schematic of current source circuit for generating I_in + and I_in−, according to an embodiment of the present invention. Current source circuit 400 includes n-channel transistors 402, 404, 406 and 408, V to I circuit 410, resistors 412, 414, and capacitors 416, 418. N-channel transistors 402, 404, 406, 408, resistors 412, 414, and capacitors 416, 418 form a noise reducing circuit. Linear correction circuit 410 receives the complementary baseband input signals IN/IN* and executes functions to maintain linearity going from V to I. The resulting voltage signals Vin and Vin* are provided to diode-connected transistors 402 and 404. Transistors 402 and 406 are arranged in a current mirror configuration, as are transistors 404 and 408. Transistors 406 and 408 are the drive transistors which generate signals I_in+ and I_in− respectively, for the merged variable gain circuit 350 of FIG. 10. Connected in-line between transistors 402 and 406 is resistor 412 and capacitor 416. Similarly, resistor 414 and capacitor 418 are connected in-line between transistors 404 and 408.

While transistors 402, 404, 406 and 408 are configured as current mirrors, functionally, transistors 402 and 404 behave as current to voltage converters for converting the outputs of linear correction circuit 410 to voltages Vin and Vin*. Transistors 406 and 408 behave as voltage to current converters for converting Vin and Vin* into corresponding currents for the merged variable gain circuit 350. The resistor-capacitor combination is effectively a low pass filter that reduces noise seen at the gate terminals of transistors 406 and 408.

The presently shown embodiment, and in particular the current mirror arrangement of transistors 402, 404, 406 and 408, provides several advantages. First, the current mirroring operation between transistors 402/406 and 404/408 is very linear, meaning that the current through either transistor 402 or 404 is substantially duplicated in respective mirroring transistors 406 and 408. Second, the sizing of transistors 406 and 408 can be scaled to increase their drive strength. For example, if transistor 402 has a unitary W/L size, mirroring transistor 406 can be scaled to 8×W/L. Third, the outputs of linear correction circuit 410 are decoupled from merged variable gain circuit 350. In the prior art, the linear correction circuit 410 outputs can be connected directly to nodes "a" and "b" of FIG. 10, without transistors 402, 404, 406 and 408, and the low pass filters.

The linear correction circuit 410 generates noise, and in the prior art configuration, this noise would propagate through to the outputs Vpin+/Vpin−. Although the low pass filter could be inserted in-line with the output of the linear correction circuit 410, the addition of a resistor would consume voltage headroom, resulting in distortion such as clipping of the signal.

Therefore, by having the low pass filters integrated with the current mirror configuration of the current source circuit 400, noise is reduced to a level where the addition of an external discrete SAW filter 38, or similar type of noise reducing circuit, is unnecessary. Therefore, the merged variable gain circuit 350 will generate even less noise if the presently shown embodiment of current source circuit 400 is used.

In summary, the embodiments of the previously described gain system provides a high range of gain, while ensuring substantially linear gain with respect to a gain control voltage. This substantially linear gain is attained by operating a CMOS variable gain circuit in the sub-threshold region, where its current then follows an exponential relationship with the applied gate source voltage. A PTAT circuit and linearizer circuit pre-condition the gain control signal to compensate for the temperature dependency of the variable gain circuit, and to offset the variable gain circuit. Because the variable gain circuit is operated in the sub-threshold region, it can be merged with the mixer/mixer circuit to minimize the number of intermediate current to voltage and voltage to current conversion stages. Further noise reduction can be realized by including a low pass filter within the input section of the merged mixer and variable gain circuit.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A gain control circuit comprising:
   a mixer sub-circuit for multiplying differential linear input currents with a complementary frequency signal for providing upconverted differential signals;
   a variable gain sub-circuit having gain transistors for passing the upconverted differential signals with a gain corresponding to a gain control voltage, as amplified differential signals; and
   a current source circuit including
      a voltage to current circuit for converting complementary input voltage signals into corresponding current signals having noise components; and
      a noise reducing circuit for receiving the corresponding current signals and filtering out substantially all the noise components, the noise reducing circuit generating the differential linear input currents, and including;
      current to voltage converters for converting the corresponding current signals into voltage signals;
      low pass filters for receiving the voltage signals and for providing noise reduced voltage signals; and,
      voltage to current converters for receiving the noise reduced voltage signals, and for generating the differential linear input currents in response to the noise reduced voltage signals.

2. The gain control circuit of claim 1, wherein the gain transistors operate in sub-threshold.

3. The gain control circuit of claim 1, wherein the gain control voltage is generated by a linearizer circuit receiving a temperature compensated voltage, the gain control voltage having a characteristic defined by $-\ln(1+e^{(-V\_COMP/\phi)})$, where V_COMP is the temperature compensated voltage, and $\phi$ is a constant kT/q for transistors of the linearizer circuit.

4. The gain control circuit of claim 1, wherein the mixer sub-circuit includes
   a first differential pair circuit for alternately passing one of the differential linear input currents to a first mixer output and a second mixer output at a frequency corresponding to the complementary frequency signal, and
   a second differential pair circuit for alternately passing the other of the differential linear input currents to the first mixer output and the second mixer output at the frequency corresponding to the complementary frequency signal.

5. The gain control circuit of claim 4, wherein the first differential pair circuit includes
   a first n-channel transistor having a source terminal for receiving the one of the differential linear input currents, a gate terminal for receiving one phase of the complementary frequency signal, and a drain terminal connected to the first mixer output,
   a second n-channel transistor having a source terminal for receiving the one of the differential linear input currents, a gate terminal for receiving another phase of the complementary frequency signal, and a drain terminal connected to the second mixer output,
   a third n-channel transistor having a source terminal for receiving the other of the differential linear input currents, a gate terminal for receiving the one phase of the complementary frequency signal, and a drain terminal connected to the second mixer output, and
   a fourth n-channel transistor having a source terminal for receiving the other of the differential linear input currents, a gate terminal for receiving the other phase of the complementary frequency signal, and a drain terminal connected to the first mixer output.

6. The gain control circuit of claim 1, wherein the variable gain sub-circuit includes
   a first differential pair circuit having a first input node for receiving one of the upconverted differential signals and a first output node for providing one of the amplified differential signals, and
   a second differential pair circuit having a second input node for receiving the other of the upconverted differential signals and a second output node for providing the other of the amplified differential signals.

7. The gain control circuit of claim 6, wherein the first differential pair circuit includes
   first and second gain transistors having a common source terminal connected to the first input node for receiving the one of the upconverted differential signals,
   a first load resistor serially connected between a power supply and a drain terminal of the first gain transistor, the first output node being located between the first load resistor and the first gain transistor and the power supply being connected to a drain terminal of the second gain transistor, and
   the second differential pair includes
   third and fourth gain transistors having a common source terminal connected to the second input node for receiving the other of the upconverted differential signals,
   a second load resistor serially connected between the power supply and a drain terminal of the third gain transistor, the second output node being located between the second load resistor and the third gain transistor and the power supply being connected to a drain terminal of the fourth gain transistor.

8. The gain control circuit of claim 7, wherein the first, second, third and fourth gain transistors are n-channel transistors operating in sub-threshold.

9. The gain control circuit of claim 1, wherein the current to voltage converters include a pair of diode-connected n-channel transistors, the voltage signals being provided from gate terminals of the pair of diode-connected n-channel transistors.

10. The gain control circuit of claim 9, wherein the voltage to current converters include a pair of n-channel drive transistors having gate terminals for receiving the noise reduced voltage signals.

11. The gain control circuit of claim 10, wherein the low pass filters include resistors connected in series between the gate terminals of the pair of diode-connected n-channel transistors and the n-channel drive transistors, and capacitors connected in parallel with the gate terminals of the n-channel drive transistors.

12. A method for controlling signal transmission gain in response to an input control signal comprising:
   a) receiving the input control voltage signal;
   b) generating in response to temperature, a temperature compensated control voltage corresponding to the input control voltage signal by converting the input control voltage signal into a current and converting the current into an intermediate voltage signal, the temperature compensated control voltage being generated from the intermediate voltage signal;
   c) linearizing the temperature compensated control voltage for generating a gain control voltage; and,
   d) controlling a gain circuit in sub-threshold in response to the gain control voltage.

13. The method for controlling signal transmission gain of claim 12, wherein the input control signal is a voltage signal.

14. The method for controlling signal transmission gain of claim 13, wherein the voltage signal is provided by a digital to analog converter.

15. The method for controlling signal transmission gain of claim 12, wherein the current can be filtered or an effective input control voltage range corresponding to the current can be shifted.

16. The method for controlling signal transmission gain of claim 12, wherein the gain control voltage linearly controls the gain circuit.

17. The method for controlling signal transmission gain of claim 16, wherein the gain control voltage is generated by a linearizer circuit, and has a characteristic defined by $-\ln(1+e^{(-V\_COMP/\phi)})$, where V_COMP is the temperature compensated control voltage, and $\phi$ is a constant kT/q for transistors of the linearizer circuit.

18. A gain system for generating a transmission signal in response to an input control voltage signal comprising:
   a voltage to current converter for converting the input control voltage signal to a current signal;
   a current control circuit for adjusting characteristics of the current signal to provide a modified current signal;
   a current to voltage converter for converting the modified current signal into an intermediate voltage;
   a proportional to absolute temperature (PTAT) circuit having temperature dependent components configured for generating a temperature dependent current;
   a voltage converter receiving the temperature dependent current as a supply for converting the intermediate voltage to a temperature compensated control voltage;
   a linearizer circuit having first input transistors for receiving the temperature compensated control voltage, the linearizer circuit preconditioning the temperature compensated voltage by generating a gain signal characterized by $-\ln(1+e^{(-V\_COMP/\phi)})$, where V_COMP is the temperature compensated voltage, and $\phi$ is a constant kT/q for the first input transistors; and,
   a variable gain circuit having second input transistors operating in a sub-threshold region for receiving the gain signal and for providing an amplified signal.

* * * * *